United States Patent
Koujima

(10) Patent No.: US 11,942,701 B2
(45) Date of Patent: Mar. 26, 2024

(54) MODULE SUBSTRATE ANTENNA AND MODULE SUBSTRATE USING SAME

(71) Applicant: TODA KOGYO CORP., Hiroshima (JP)

(72) Inventor: Jun Koujima, Otake (JP)

(73) Assignee: TODA KOGYO CORP., Hiroshima (JP)

(\*) Notice: Subject to any disclaimer, the term of this patent is extended or adjusted under 35 U.S.C. 154(b) by 174 days.

(21) Appl. No.: 17/756,369

(22) PCT Filed: Dec. 1, 2020

(86) PCT No.: PCT/JP2020/044698
§ 371 (c)(1),
(2) Date: May 24, 2022

(87) PCT Pub. No.: WO2021/112086
PCT Pub. Date: Jun. 10, 2021

(65) Prior Publication Data
US 2023/0006352 A1    Jan. 5, 2023

(30) Foreign Application Priority Data
Dec. 3, 2019  (JP) .................... 2019-219050

(51) Int. Cl.
*H01Q 7/00*       (2006.01)
*G06K 19/077*     (2006.01)
(Continued)

(52) U.S. Cl.
CPC ......... *H01Q 7/00* (2013.01); *G06K 19/07783* (2013.01); *G06K 19/07784* (2013.01); *H05K 1/0243* (2013.01); *H01Q 1/2208* (2013.01)

(58) Field of Classification Search
CPC ...... H01Q 7/00; H01Q 1/2208; H05K 1/0243; G06K 19/07783; G06K 19/07784
See application file for complete search history.

(56) References Cited

U.S. PATENT DOCUMENTS 5,608,417 A * 3/1997 de Vall ............. G06K 19/07784
                                                     343/895
9,917,367 B2 * 3/2018 Yosui .................... H01Q 1/523
(Continued)

FOREIGN PATENT DOCUMENTS

EP    1983531 A1 * 10/2008 ......... H01F 17/0013
EP    4053742 A1 *  9/2022 ......... G06K 19/0723
(Continued)

OTHER PUBLICATIONS

International Search Report and Written Opinion for PCT/JP2020/044698 (ISA/JP) dated Feb. 22, 2021, (8 pages).

*Primary Examiner* — Ricardo I Magallanes
*Assistant Examiner* — Jordan E. DeWitt
(74) *Attorney, Agent, or Firm* — Alston & Bird LLP

(57) ABSTRACT

A module substrate antenna (1) includes a first coil (7) and a second coil (8) that are connected in parallel. The first coil (7) is composed of a pattern in which a spiral first antenna coil pattern (3a) and a spiral second antenna coil pattern (5a) are interlayer-connected in series. The second coil (8) is composed of a pattern in which a spiral third antenna coil pattern (4a) and a spiral fourth antenna coil pattern (6a) are interlayer-connected in series. The coil patterns are arranged in order of the first antenna coil pattern (3a), the third antenna coil pattern (4a), the second antenna coil pattern (5a), and the fourth antenna coil pattern (6a).

7 Claims, 9 Drawing Sheets

(51) Int. Cl.
*H01Q 1/22* (2006.01)
*H05K 1/02* (2006.01)

(56) References Cited

U.S. PATENT DOCUMENTS

| | | | | |
|---|---|---|---|---|
| 11,171,686 B2 * | 11/2021 | Cheikh | ................... | H04B 5/77 |
| 2011/0031320 A1 * | 2/2011 | Kato | ................... | H01Q 1/2225 |
| | | | | 235/492 |
| 2013/0147675 A1 * | 6/2013 | Kato | ..................... | H01Q 1/40 |
| | | | | 343/788 |
| 2013/0154783 A1 * | 6/2013 | Kato | ..................... | H01F 19/04 |
| | | | | 336/200 |
| 2013/0229319 A1 * | 9/2013 | Miura | ..................... | H01Q 7/08 |
| | | | | 343/788 |
| 2014/0062817 A1 * | 3/2014 | Ishizuka | ................. | H03H 7/40 |
| | | | | 330/192 |
| 2014/0319230 A1 * | 10/2014 | Murayama | ............. | H01F 38/14 |
| | | | | 235/492 |
| 2015/0035718 A1 * | 2/2015 | Gouchi | ................... | H01Q 1/38 |
| | | | | 343/788 |
| 2015/0214611 A1 * | 7/2015 | Kato | ....................... | H01Q 9/30 |
| | | | | 343/860 |
| 2018/0373973 A1 * | 12/2018 | Sonnenberg | ...... | G06K 19/07773 |
| 2019/0304662 A1 * | 10/2019 | Koujima | ............... | H01F 27/292 |
| 2021/0335533 A1 * | 10/2021 | Mikawa | ............... | H03H 7/0115 |
| 2023/0006352 A1 * | 1/2023 | Koujima | ............... | H05K 1/0243 |

FOREIGN PATENT DOCUMENTS

| | | | | |
|---|---|---|---|---|
| JP | 2015-159617 | A | | 9/2015 |
| JP | 2016-034153 | A | | 3/2016 |
| JP | 2018-166160 | A | | 10/2018 |
| JP | 2018166160 | A | * | 10/2018 |
| JP | 2019-180021 | A | | 10/2019 |
| WO | WO-2021085269 | A1 | * | 5/2021 ......... G06K 19/0723 |

* cited by examiner

MODULE SUBSTRATE ANTENNA AND MODULE SUBSTRATE USING SAME

CROSS REFERENCE TO RELATED APPLICATIONS

This application is a National Stage Application, filed under 35 U.S.C. § 371, of International Application No. PCT/JP2020/044698, filed Dec. 1, 2020, which claims priority to Japanese Application No. 2019-219050, filed Dec. 3, 2019; the contents of both of which as are hereby incorporated by reference in their entirety.

BACKGROUND

Related Field

The present invention relates to antennas for module substrates on which an IC chip etc. is mounted and which function as a module for wireless communication, and module substrates using the same.

Description of Related Art

In recent years, IC modules (contactless IC tags and IC cards) that transmit and receive signals in a contactless manner have been increasingly popular. Such an IC module includes a wire for an antenna that is a conductor wire formed on a surface of an insulating substrate. The IC module can transmit and receive signals in a contactless manner by this antenna wire.

For example, a module substrate antenna is disclosed in which three coils with different sizes (outer dimensions as viewed in plan) are disposed inside an insulating substrate and these three coils are arranged so as to overlap each other in the stacking direction of insulating layers (see, e.g., Japanese Unexamined Patent Publication No. 2018-166160).

BRIEF SUMMARY

However, in the module substrate antenna described in Patent Document 1, the coils need to have different sizes, and the number of turns of coil patterns and the area of the coil patterns are limited. Therefore, the inductance of all the coils cannot be maximized. As a result, it is difficult to increase the combined inductance of the coils.

It is therefore an object of the present invention to provide a module substrate antenna capable of further increasing the combined inductance of coils by reducing the parasitic capacitance of the antenna coils in addition to the above problem.

In order to achieve the above object, a module substrate antenna of the present invention is characterized by including first and second coils connected in parallel. The first coil is composed of a pattern in which a spiral first antenna coil pattern and a spiral second antenna coil pattern are interlayer-connected in series. The second coil is composed of a pattern in which a spiral third antenna coil pattern and a spiral fourth antenna coil pattern are interlayer-connected in series. The first antenna coil pattern, the third antenna coil pattern, the second antenna coil pattern, and the fourth antenna coil pattern are located in this order. The first to fourth antenna coil patterns are wounded so that directions of a current flowing through the first to fourth antenna coil patterns are all the same direction with respect to an axis of the coil, are wound so that the directions of a current in the first and third antenna coil patterns are the same direction with respect to a radial direction of the coil, and are wound so that the directions of a current in the second and fourth antenna coil patterns are an opposite direction to the direction of a current in the first and third antenna coil patterns with respect to the radial direction of the coil.

According to the module substrate antenna of the present invention, the parasitic capacitance of the antenna coils can be reduced, and the combined inductance of the coils can be increased.

DETAILED DESCRIPTION OF VARIOUS EMBODIMENTS

Hereinafter, embodiments of the present invention will be described in detail with reference to the drawings.

First Embodiment

Figure 1:
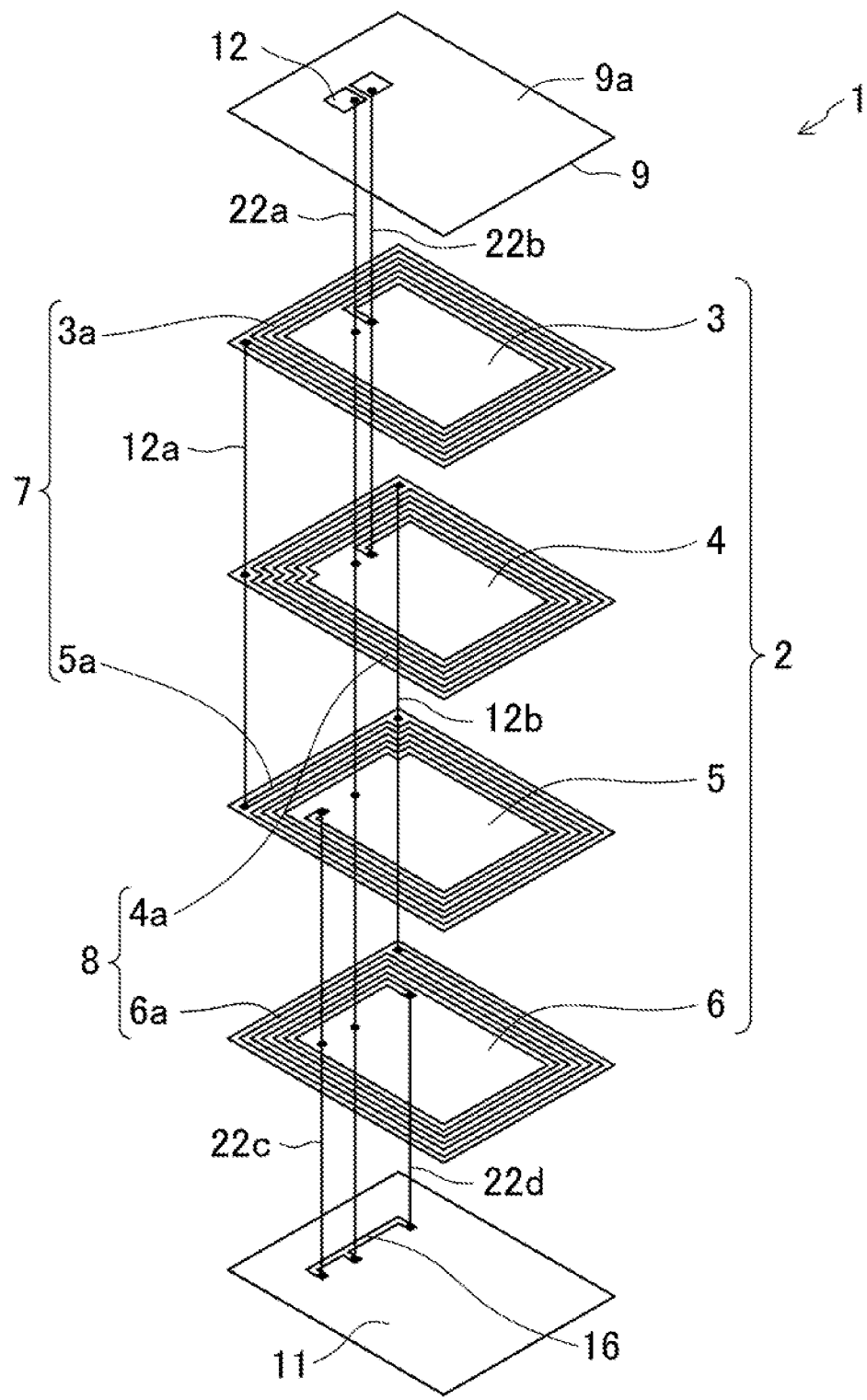
FIG. 1 is an exploded perspective view of a module substrate according to a first embodiment.
Figure 2:
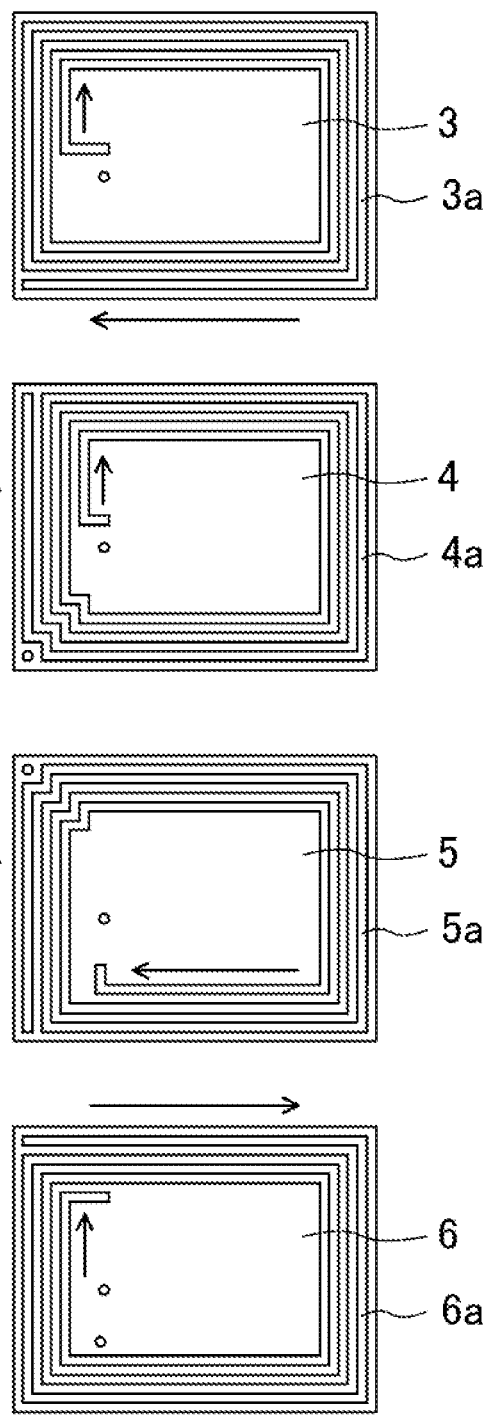
FIG. 2 shows plan views illustrating antenna patterns forming the module substrate according to the first embodiment.

FIG. 1 is an exploded perspective view of a module substrate according to the present embodiment, and FIG. 2 shows plan views illustrating antenna patterns forming the module substrate according to the present embodiment.

As shown in FIG. 1, a module substrate 1 includes a stack 2 of a plurality of (four in the present embodiment) insulating layers 3 to 6, an IC mounting insulating layer 9 located on the uppermost layer of the stack 2, and an insulating layer 11 located on the lowermost layer of the stack 2.

The insulating layers 3 to 6 are made of, for example, a non-magnetic material composed of a non-magnetic ferrite, and the stack 2 is formed by stacking the insulating layers 3 to 6.

For example, Zn ferrite powder can be used as a main component of the non-magnetic material, and the composition ratio of the components is preferably as follows: $Fe_2O_3$: 40.0 to 50.0 mol %, ZnO: 35.0 to 50.0 mol %, and CuO: 5 to 20 mol %.

Although the thickness of each insulating layer 3 to 6 is not particularly limited, the thickness of each insulating layer 3 to 6 is preferably 20 μm to 100 μm when a multilayer ceramic technique using green sheets is performed.

As shown in FIG. 1, the IC mounting insulating layer 9 is located on an IC mounting surface of the uppermost insulating layer 3 of the stack 2, and IC mounting electrodes 12 are located on an outer surface 9a of the insulating layer 9. Like the insulating layers 3 to 6 described above, the insulating layer 9 can be made of, for example, a non-magnetic material composed of a non-magnetic ferrite.

As shown in FIG. 1, a first antenna coil pattern 3a, a second antenna coil pattern 5a, a third antenna coil pattern 4a, and a fourth antenna coil pattern 6a are provided on the surfaces of the plurality of insulating layers 3 to 6, respectively. The first to fourth antenna coil patterns 3a to 6a are made of an electrically conductive material, and are formed by an antenna pattern wound into a rectangular spiral shape.

As shown in FIG. 1, a first coil 7 is formed by the first antenna coil pattern 3a and the second antenna coil pattern 5a, and the first antenna coil pattern 3a and the second antenna coil pattern 5a are interlayer-connected in series.

Similarly, a second coil 8 is formed by the third antenna coil pattern 4a and the fourth antenna coil pattern 6a, and the third antenna coil pattern 4a and the fourth antenna coil pattern 6a are interlayer-connected in series.

As shown in FIG. 1, the first coil 7 and the second coil 8 are connected in parallel.

As shown in FIG. 1, the present embodiment is characterized in that the first to fourth antenna coil patterns 3a to 6a are arranged in order of the first antenna coil pattern 3a, the third antenna coil pattern 4a, the second antenna coil pattern 5a, and the fourth antenna coil pattern 6a in the stack 2.

Therefore, the third antenna coil pattern 4a is located between the first antenna coil pattern 3a and the second antenna coil pattern 5a, and the second antenna coil pattern 5a is located between the third antenna coil pattern 4a and the fourth antenna coil pattern 6a. Since a layer of another series coil is thus interposed between the layers of a series coil, the distance between the layers of the series coil can be doubled. As a result, the parasitic capacitance of one series coil can be reduced to ½. Therefore, the combined inductance of the first and second coils 7, 8 connected in parallel can be increased.

As shown in FIG. 1, the insulating layer 11 for a routing wire is located on the lowermost insulating layer 6 of the stack 2. A routing wire 16 for connecting an end of the first coil 7 and an end of the second coil 8 in parallel and connecting the first coil 7 and the second coil 8 to the IC mounting electrodes 12 via through holes is located on the surface of the insulating layer 11.

Like the insulating layers 3 to 6 described above, the insulating layer 11 can be made of, for example, a non-magnetic material composed of a non-magnetic ferrite. The material forming the routing wire 16 is not particularly limited, but for example, an electrically conductive material that forms the antenna coil patterns 3a to 6a described above can be used.

The insulating layers 3 to 6 are provided with interlayer connection conductors 12a, 12b extending through the insulating layers 3 to 6 in the thickness direction. The first antenna coil pattern 3a and the second antenna coil pattern 5a are electrically connected via the interlayer connection conductor 12a, and the third antenna coil pattern 4a and the fourth antenna coil pattern 6a are electrically connected via the interlayer connection conductor 12b.

The insulating layers 3 to 6 and the insulating layers 9, 11 are provided with an interlayer connection conductor 22a extending through the insulating layers 3 to 6 and the insulating layers 9, 11 in the thickness direction. The routing wire 16 is electrically connected to the IC mounting electrode 12 via the interlayer connection conductor 22a. The first antenna coil pattern 3a and the third antenna coil pattern 4a are electrically connected to the IC mounting electrode 12 via the interlayer connection conductor 22b, and the second antenna coil pattern 5a and the fourth antenna coil pattern 6a are electrically connected to the routing wire 16 via interlayer connection conductors 22c, 22d.

The materials forming the first to fourth antenna coil patterns 3a to 6a and the interlayer connection conductors 12a, 12b, 20a to 20d are not particularly limited, but for example, silver, copper, etc. can be used.

In the present embodiment, as described above, the first antenna coil pattern 3a and the second antenna coil pattern 5a are interlayer-connected in series, and the third antenna coil pattern 4a and the fourth antenna coil pattern 6a are interlayer-connected in series. However, since the end layers of the series coils (that is, the first antenna coil pattern 3a and the third antenna coil pattern 4a; and the second antenna coil pattern 5a and the fourth antenna coil pattern 6a) are located close to each other, the routing wire 16 for connecting the first coil 7 and the second coil 8 in parallel can be shortened, as shown in FIG. 1. Therefore, the parasitic capacitance generated in the connection wires can be reduced.

As shown in FIG. 2, the first to fourth antenna coil patterns 3a to 6a are wound so that the directions of a current flowing through the first to fourth antenna coil patterns 3a to 6a (directions of arrows in the figure) are all the same direction (that is, all clockwise) with respect to the axis of the coil, are wound so that the directions of a current in the first and third antenna coil patterns 3a, 4a are the same direction (that is, from inside to outside as viewed in plan) with respect to the radial direction of the coil, and are wound so that the directions of a current in the second and fourth antenna coil patterns 5a, 6a are the opposite direction to the direction of a current in the first and third antenna coil patterns 3a, 4a (that is, from outside to inside as viewed in plan) with respect to the radial direction of the coil.

Accordingly, the magnetic fields generated from each coil pattern do not interfere with each other. The inductance is therefore not reduced, and the communication sensitivity of an antenna can be increased.

Second Embodiment

Figure 3:
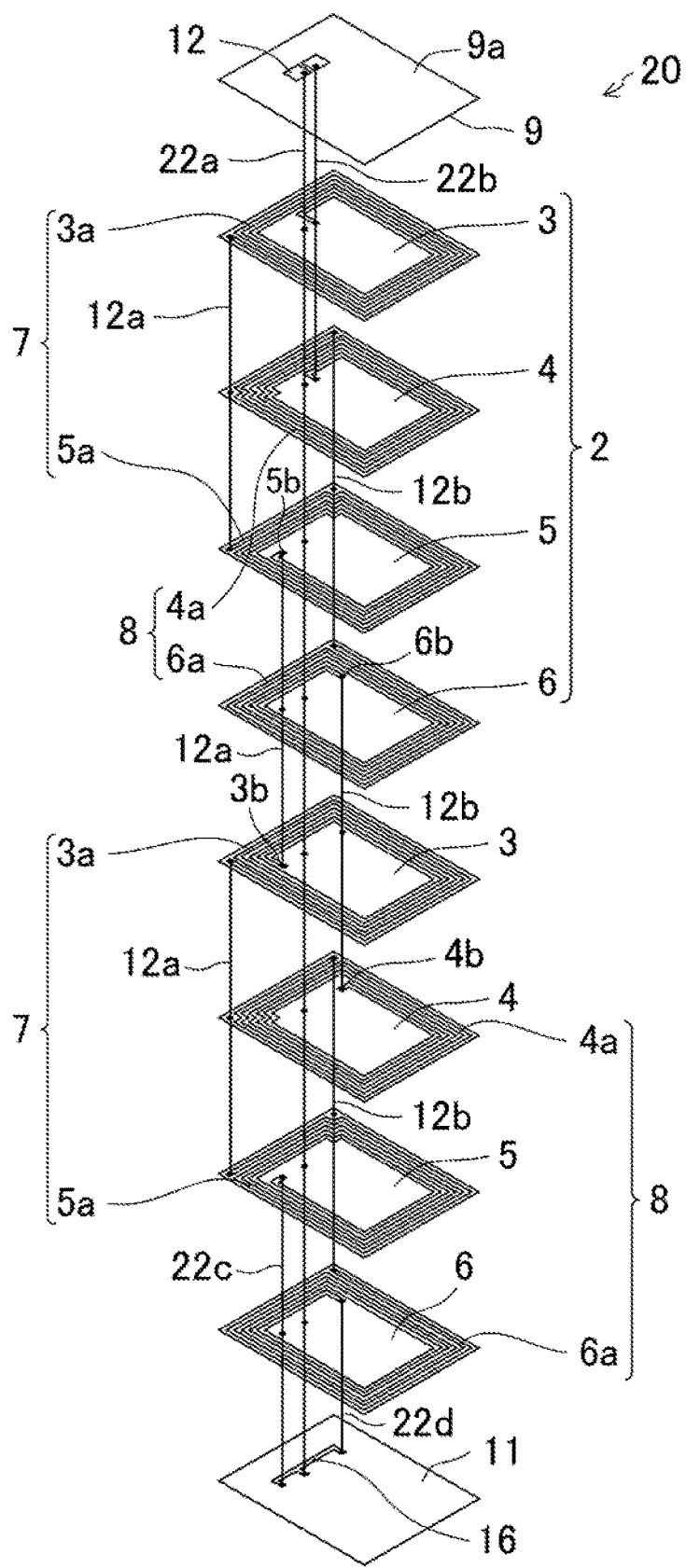
FIG. 3 is an exploded perspective view of a module substrate according to a second embodiment of the present invention.

Next, a second embodiment of the present invention will be described. FIG. 3 is an exploded perspective view of a module substrate according to a second embodiment of the present invention. Components similar to those of the first embodiment are denoted by the same reference characters, and description thereof will be omitted.

As shown in FIG. 3, a module substrate 20 of the present embodiment is characterized in that the module substrate 20 includes pluralities of the first and second coils 7, 8 (in this example, two each), each formed by arranging the first antenna coil pattern 3a, the third antenna coil pattern 4a, the second antenna coil pattern 5a, and the fourth antenna coil pattern 6 in this order.

With such a configuration, the following effects can be obtained in addition to the effects described above in the first embodiment.

That is, the first coils 7 are composed of the repetition of the first antenna coil pattern 3a and the second antenna coil pattern 5a that are interlayer-connected in series, and the second coils 8 are composed of the repetition of the third antenna coil pattern 4a and the fourth antenna coil pattern 6a that are interlayer-connected in series. Therefore, as shown in FIG. 3, a winding start 3b of the first antenna coil pattern 3a and a winding end 5b of the second antenna coil pattern 5a can be aligned, and a winding start 4b of the third antenna coil pattern 4a and a winding end 6b of the fourth antenna coil pattern 6a can be aligned.

Since the wireable range can be used to the maximum extent possible in the insulating layers 3 to 6, the number of turns of the first to fourth antenna coil patterns 3a to 6a can be increased, and as a result, the combined inductance of the first and second coils 7, 8 connected in parallel can be increased.

Since the winding start 3b of the first antenna coil pattern 3a and the winding end 5b of the second antenna coil pattern 5a can be aligned and the winding start 4b of the third antenna coil pattern 4a and the winding end 6b of the fourth antenna coil pattern 6a can be aligned, the interlayer connection conductors 12a, 12b can be shortened. As a result, the parasitic capacitance generated in the interlayer connection conductors 12a, 12 b can be reduced.

Figure 4:
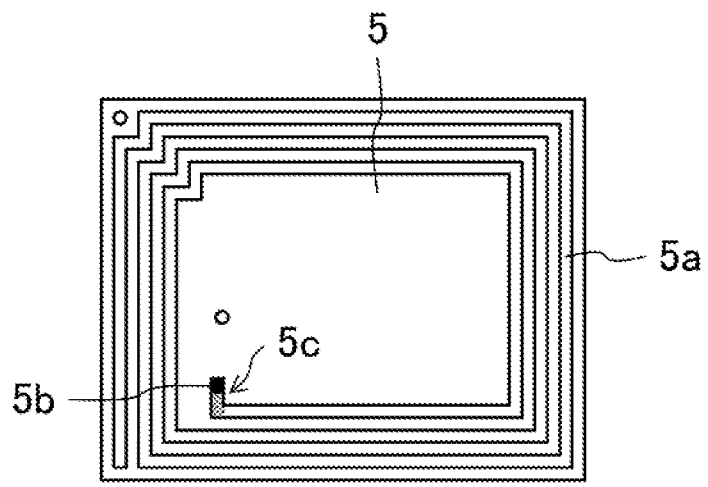
FIG. 4 is a plan view showing a winding end region of a second antenna coil pattern.
Figure 5:
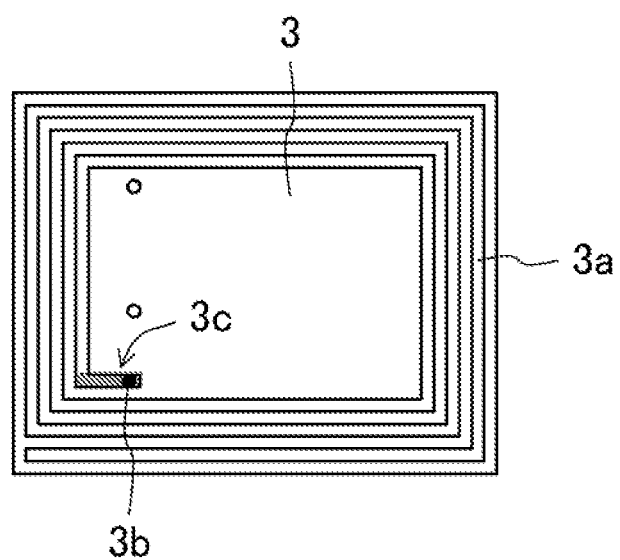
FIG. 5 is a plan view showing a winding start region of a first antenna coil pattern.

The expression "the winding start 3b of the first antenna coil pattern 3a and the winding end 5b of the second antenna coil pattern 5a are aligned" refers to the state in which a part of a winding start region 3c of the first antenna coil pattern 3a and a part of a winding end region 5c of the second antenna coil pattern 5a overlap each other as viewed in plan shown in FIGS. 4 and 5, and is not limited to the state in which the winding start 3b of the first antenna coil pattern 3a and the winding end 5b of the second antenna coil pattern 5a overlap each other as viewed in plan.

The length of the winding start region 3c and the length of the winding end region 5c in the axis of the coil is not particularly limited, but is preferably ¼ or less of the length of one turn of the coil.

Like the above expression "the winding start 3b of the first antenna coil pattern 3a and the winding end 5b of the second antenna coil pattern 5a are aligned," the expression "the winding start 4b of the third antenna coil pattern 4a and the winding end 6b of the fourth antenna coil pattern 6a are aligned" also refers to the state in which a part of a winding start region of the third antenna coil pattern 4a and a part of a winding end region of the fourth antenna coil pattern 6a overlap each other as viewed in plan, and is not limited to the state in which the winding start 4b of the third antenna coil pattern 4a and the winding end 6b of the fourth antenna coil pattern 6a overlap each other as viewed in plan.

Third Embodiment

Figure 6:
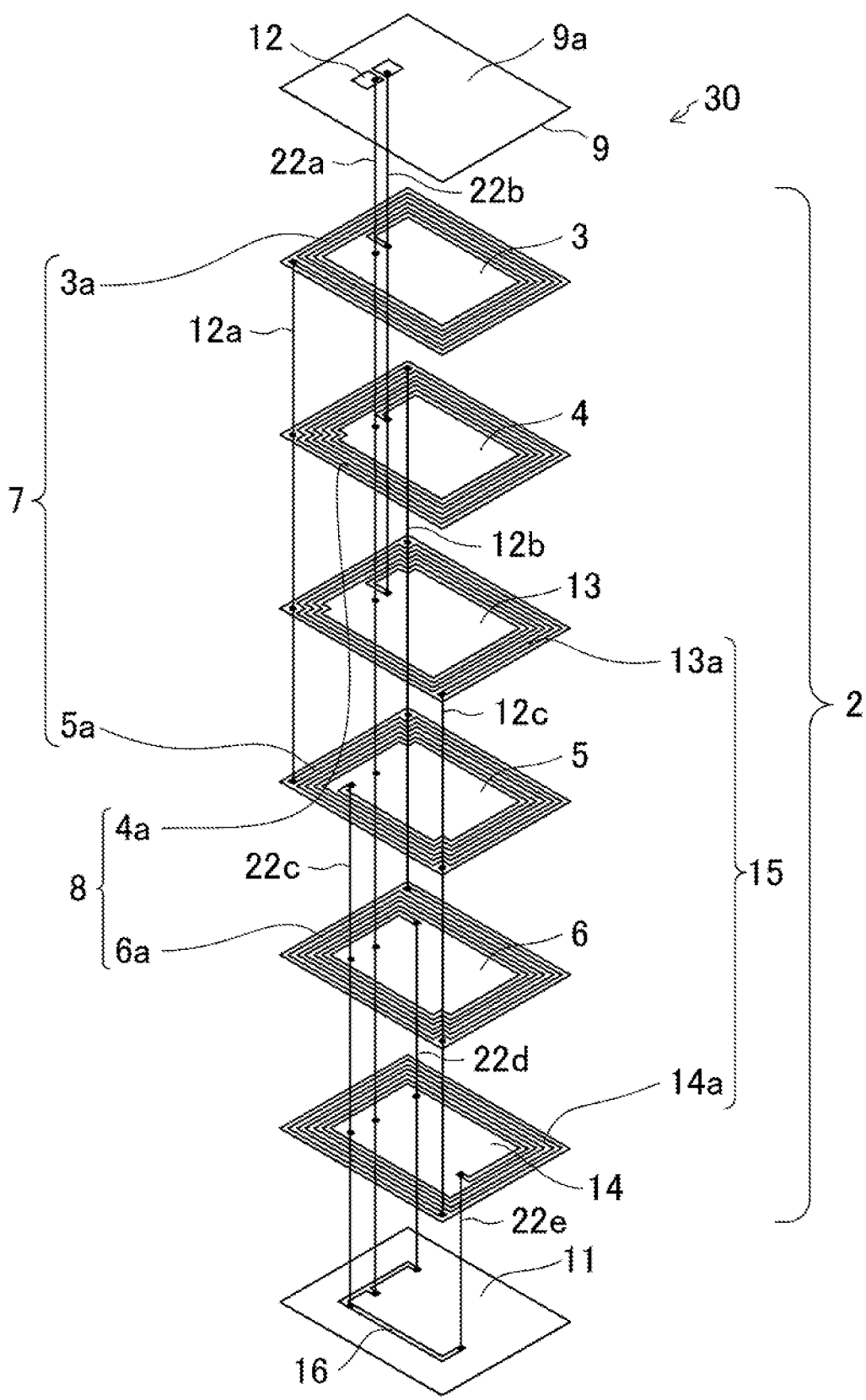
FIG. 6 is an exploded perspective view of a module substrate according to a third embodiment of the present invention.

Next, a third embodiment of the present invention will be described. FIG. 6 is an exploded perspective view of a module substrate according to a third embodiment of the present invention. Components similar to those of the above embodiments are denoted by the same reference characters, and description thereof will be omitted.

As shown in FIG. 6, a module substrate 30 of the present embodiment includes a third coil 15 composed of a fifth antenna coil pattern 13a and a sixth antenna coil pattern 14a, in addition to the first coil 7 and the second coil 8 of the first embodiment described above.

More specifically, an insulating layer 13 is located between the insulating layers 4, 5, and the fifth antenna coil pattern 13a is located on a surface of the insulating layer 13. An insulating layer 14 is located between the insulating layer 6 and the insulating layer 11, and the sixth antenna coil pattern 14a is located on a surface of the insulating layer 14.

The insulating layers 13, 14 are made of, for example, the above non-magnetic material composed of a non-magnetic ferrite.

Like the first to fourth antenna coil patterns 3a to 6a described above, the fifth and sixth antenna coil patterns 13a, 14a are made of an electrically conductive material, and are formed by an antenna pattern wound into a rectangular spiral shape.

The module substrate 30 includes a stack 2 of a plurality of (six in the present embodiment) insulating layers 3 to 6, 13, and 14, and the third coil 15 is connected in parallel with the first and second coils 7, 8.

As shown in FIG. 6, the present embodiment is characterized in that the first antenna coil pattern 3a, the third antenna coil pattern 4a, the fifth antenna coil pattern 13a, the second antenna coil pattern 5a, the fourth antenna coil pattern 6a, and the sixth antenna coil pattern 14a are arranged in this order in the stack 2.

Therefore, the third antenna coil pattern 4a and the fifth antenna coil pattern 13a are located between the first antenna coil pattern 3a and the second antenna coil pattern 5a. The fifth antenna coil pattern 13a and the second antenna coil pattern 5a are located between the third antenna coil pattern 4a and the fourth antenna coil pattern 6a. The second antenna coil pattern 5a and the fourth antenna coil pattern 6a are located between the fifth antenna coil pattern 13a and the sixth antenna coil pattern 14a. Layers of other series coils are thus interposed between the layers of a series coil. Accordingly, the distance between the layers of the series coil can be tripled, and the parasitic capacitance of one series coil can therefore be reduced to ⅓. As a result, the combined inductance of the first, second, and third coils 7, 8, 15 connected in parallel can be increased.

The stack 2 is provided with an interlayer connection conductor 12c, and the fifth antenna coil pattern 13a and the sixth antenna coil pattern 14a are electrically connected via the interlayer connection conductor 12c.

The module substrate 30 is provided with an interlayer connection conductor 22e, and the sixth antenna coil pattern 14a is electrically connected to the routing wire 16 via the interlayer connection conductor 22e.

The materials forming the antenna coil patterns 13a, 14a and the interlayer connection conductors 22d, 22e are not particularly limited, but for example, silver, copper, etc. can be used.

In the present embodiment, as described above, the first antenna coil pattern 3a and the second antenna coil pattern 5a are interlayer-connected in series, the third antenna coil pattern 4a and the fourth antenna coil pattern 6a are interlayer-connected in series, and the fifth antenna coil pattern 13a and the sixth antenna coil pattern 14a are interlayer-connected in series. However, since the end layers of the series coils (that is, the first antenna coil pattern 3a, the third antenna coil pattern 4a, and the fifth antenna coil pattern 13a; and the second antenna coil pattern 5a, the fourth antenna coil pattern 6a, and the sixth antenna coil pattern 14a) are located close to each other, the routing wire 16 for connecting the first coil 7, the second coil 8, and the third coil 15 in parallel can be shortened, as shown in FIG. 6. Therefore, the parasitic capacitance generated in the connection wires can be reduced.

Figure 7:
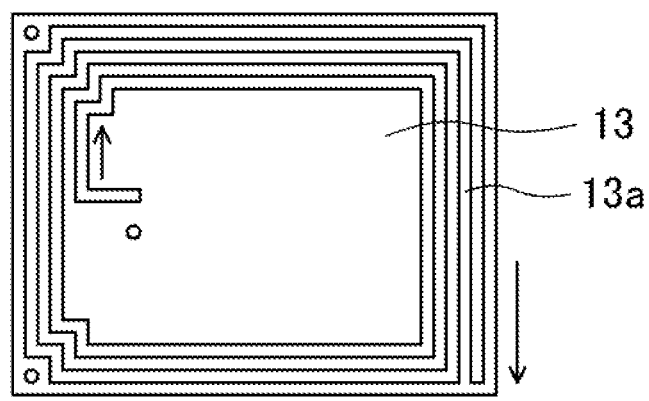
FIG. 7 shows plan views illustrating antenna patterns forming the module substrate according to the third embodiment of the present invention.
Figure 7:
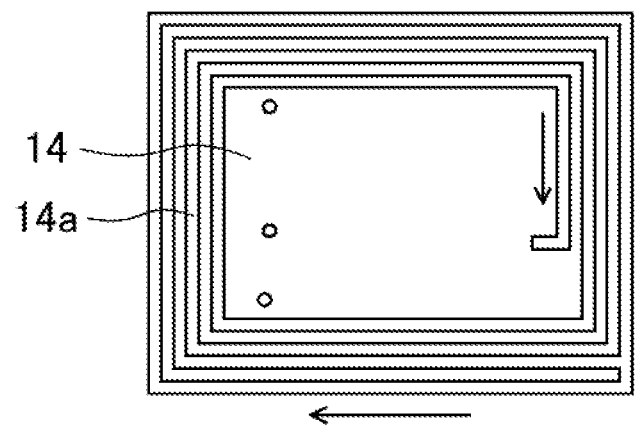

As shown in FIGS. 2 and 7, the first to sixth antenna coil patterns 3a to 6a, 13a, and 14a are wound so that the directions of a current flowing through the first to sixth antenna coil patterns 3a to 6a, 13a, and 14a (directions of arrows in the figures) are all the same direction (that is, all clockwise) with respect to the axis of the coil, are wound so that the directions of a current in the first, third, and fifth antenna coil patterns 3a, 4a, and 13a are the same direction (that is, from inside to outside as viewed in plan) with respect to the radial direction of the coil, and are wound so that the directions of a current in the second, fourth, and sixth antenna coil patterns 5a, 6a, and 14a are the opposite direction to the direction of a current in the first, third, and fifth antenna coil patterns 3a, 4a, and 13a (that is, from outside to inside as viewed in plan) with respect to the radial direction of the coil.

Accordingly, the magnetic fields generated from each coil pattern do not interfere with each other. The inductance is therefore not reduced, and the communication sensitivity of an antenna can be increased.

Fourth Embodiment

Figure 8:
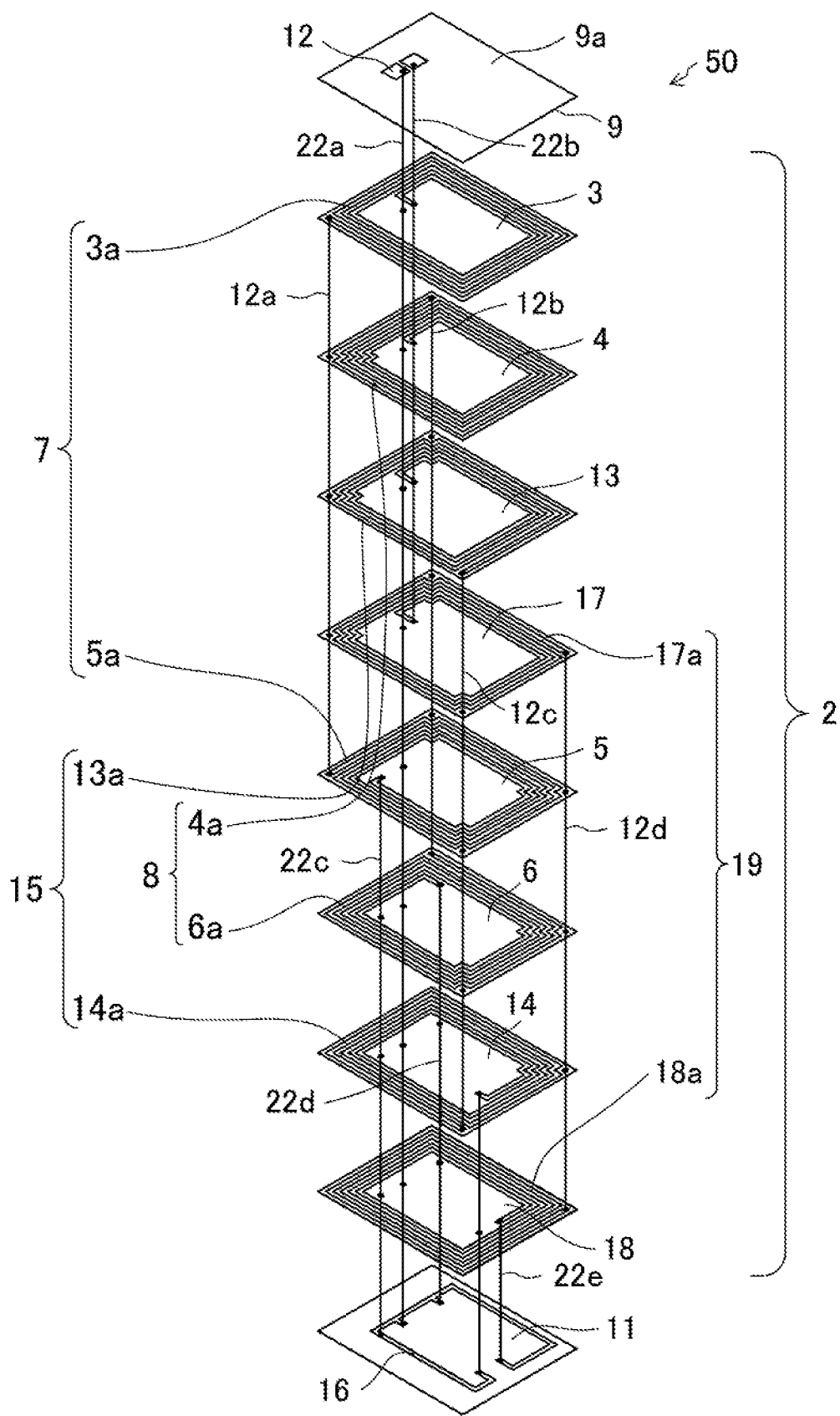
FIG. 8 is an exploded perspective view of a module substrate according to a fourth embodiment of the present invention.

Next, a fourth embodiment of the present invention will be described. FIG. 8 is an exploded perspective view of a module substrate according to a fourth embodiment of the present invention. Components similar to those of the above embodiments are denoted by the same reference characters, and description thereof will be omitted.

As shown in FIG. 8, a module substrate 50 of the present embodiment includes a fourth coil 19 composed of a seventh antenna coil pattern 17a and an eighth antenna coil pattern 18a, in addition to the first to third coils 7, 8, and 15 of the third embodiment described above.

More specifically, an insulating layer 17 is located between the insulating layers 13, 5, and the seventh antenna coil pattern 17a is located on a surface of the insulating layer 17. An insulating layer 18 is located between the insulating layer 14 and the insulating layer 11, and the eighth antenna coil pattern 18a is located on a surface of the insulating layer 18.

The insulating layers 17, 18 are made of, for example, the non-magnetic material composed of a non-magnetic ferrite.

Like the first to sixth antenna coil patterns 3a to 6a, 13a, and 14a described above, the seventh and eighth antenna coil patterns 17a, 18a are made of an electrically conductive material, and are formed by an antenna pattern wound into a rectangular spiral shape.

The module substrate 50 includes a stack 2 of a plurality of (eight in the present embodiment) insulating layers 3 to 6, 13, 14, 17, and 18, and the fourth coil 19 is connected in parallel with the first and second coils 7, 8 and the third coil 15.

As shown in FIG. 8, the present embodiment is characterized in that the first antenna coil pattern 3a, the third antenna coil pattern 4a, the fifth antenna coil pattern 13a, the seventh antenna coil pattern 17a, the second antenna coil pattern 5a, the fourth antenna coil pattern 6a, the sixth antenna coil pattern 14a, and the eighth antenna coil pattern 18a are arranged in this order in the stack 2.

Therefore, the third antenna coil pattern 4a, the fifth antenna coil pattern 13a, and the seventh antenna coil pattern 17a are located between the first antenna coil pattern 3a and the second antenna coil pattern 5a. The fifth antenna coil pattern 13a, the seventh antenna coil pattern 17a, and the second antenna coil pattern 5a are located between the third antenna coil pattern 4a and the fourth antenna coil pattern 6a. The seventh antenna coil pattern 17a, the second antenna coil pattern 5a, and the fourth antenna coil pattern 6a are located between the fifth antenna coil pattern 13a and the sixth antenna coil pattern 14a. The second antenna coil pattern 5a, the fourth antenna coil pattern 6a, and the sixth antenna coil pattern 14a are located between the seventh antenna coil pattern 17a and the eighth antenna coil pattern 18a. Layers of other series coils are thus interposed between the layers of a series coil. Accordingly, the distance between the layers of the series coil can be quadrupled, and the parasitic capacitance of one series coil can therefore be reduced to ¼. As a result, the combined inductance of the first, second, and third, and fourth coils 7, 8, 15, and 19 connected in parallel can be increased.

The stack 2 is provided with an interlayer connection conductor 12d, and the seventh antenna coil pattern 17a and the eighth antenna coil pattern 18a are electrically connected via the interlayer connection conductor 12d.

The eighth antenna coil pattern 18a is electrically connected to the routing wire 16 via the interlayer connection conductor 22e.

The material forming the antenna coil patterns 17a, 18a is not particularly limited, but for example, silver, copper, etc. can be used.

In the present embodiment, as described above, the first antenna coil pattern 3a and the second antenna coil pattern 5a are interlayer-connected in series, the third antenna coil pattern 4a and the fourth antenna coil pattern 6a are interlayer-connected in series, the fifth antenna coil pattern 13a and the sixth antenna coil pattern 14a are interlayer-connected in series, and the seventh antenna coil pattern 17a and the eighth antenna coil pattern 18a are interlayer-connected in series. However, since the end layers of the series coils (that is, the first antenna coil pattern 3a, the third antenna coil pattern 4a, the fifth antenna coil pattern 13a, and the seventh antenna coil pattern 17a; and the second antenna coil pattern 5a, the fourth antenna coil pattern 6a, the sixth antenna coil pattern 14a, and the eighth antenna coil pattern 18a) are located close to each other, the routing wire 16 for connecting the first coil 7, the second coil 8, the third coil 15, and the fourth coil 19 in parallel can be shortened, as shown in FIG. 8. Therefore, the parasitic capacitance generated in the connection wires can be reduced.

Figure 9:
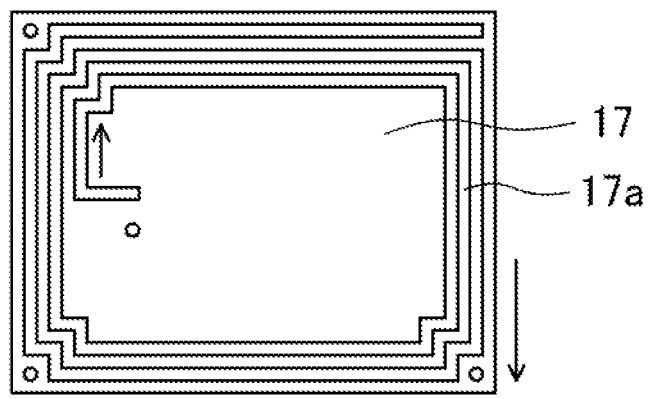
FIG. 9 shows plan views illustrating antenna patterns forming the module substrate according to the fourth embodiment of the present invention.
Figure 9:
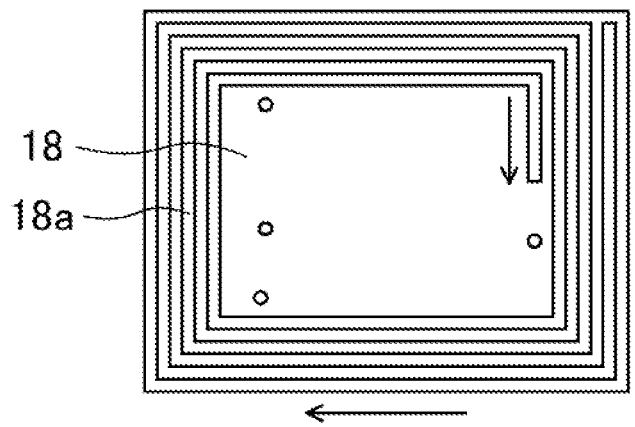

As shown in FIGS. 2, 7, and 9, the first to eighth antenna coil patterns 3a to 6a, 13a, 14a, 17a, and 18a are wound so that the directions of a current flowing through the first to eighth antenna coil patterns 3a to 6a, 13a, 14a, 17a, and 18a (directions of arrows in the figures) are all the same direction (that is, all clockwise) with respect to the axis of the coil, are wound so that the directions of a current in the first, third, fifth, and seventh antenna coil patterns 3a, 4a, 13a, and 17a are the same direction (that is, from inside to outside as viewed in plan) with respect to the radial direction of the coil, and are wound so that the directions of a current in the second, fourth, sixth, and eighth antenna coil patterns 5a, 6a, 14a, and 18a are the opposite direction to the direction of a current in the first, third, fifth, and seventh antenna coil patterns 3a, 4a, 13a, and 17a (that is, from outside to inside as viewed in plan) with respect to the radial direction of the coil.

Accordingly, the magnetic fields generated from each coil pattern do not interfere with each other. The inductance is therefore not reduced, and the communication sensitivity of an antenna can be increased.

The above embodiments may be modified as follows.

Figure 10:
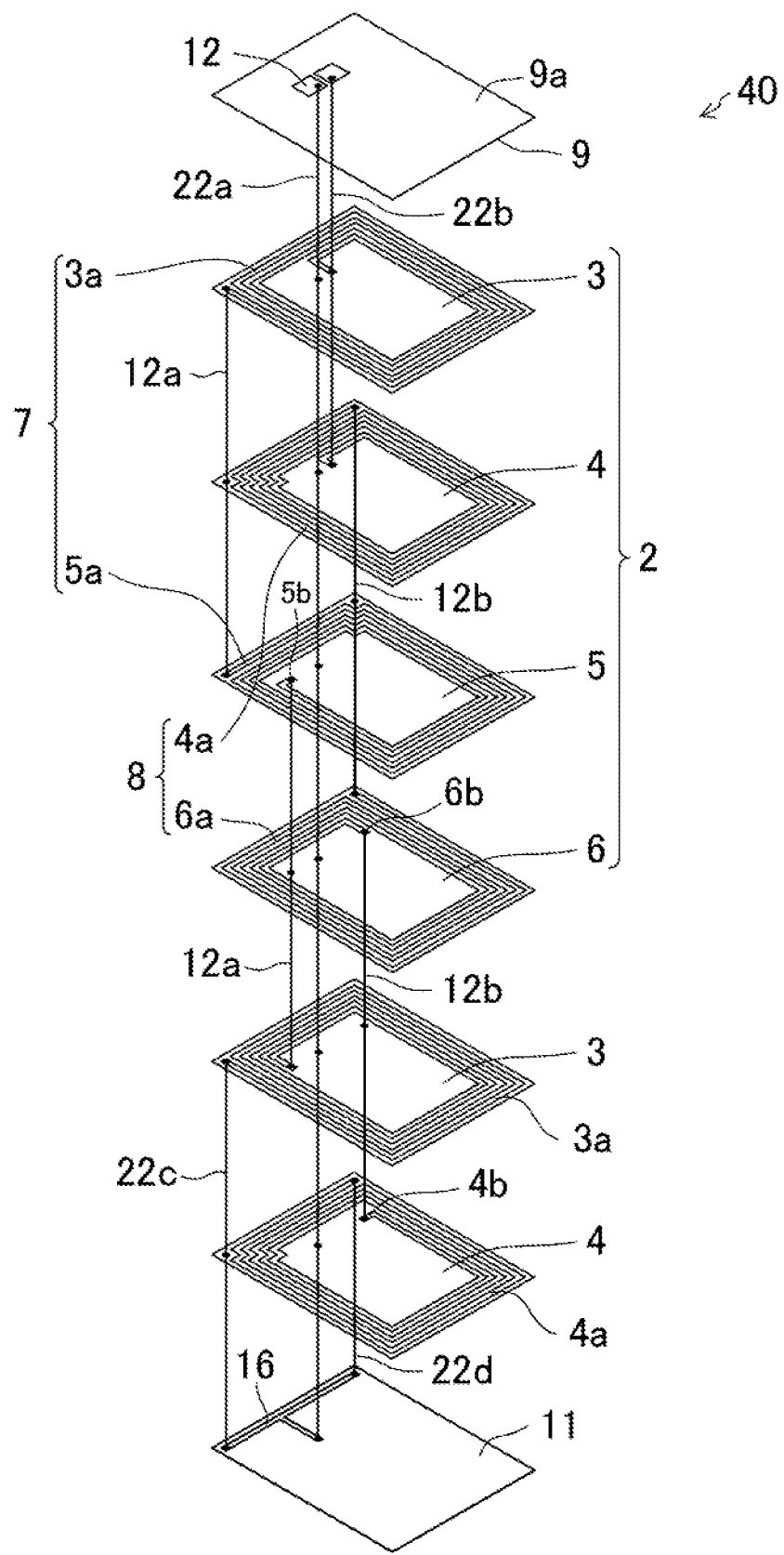
FIG. 10 is an exploded perspective view of a module substrate according to a modification.

In the second embodiment (FIG. 3), the pluralities of first and second coils 7, 8 (two each) are provided. However, as in a module substrate 40 shown in FIG. 10, the two layers (insulating layers 5, 6) on the insulating layer 11 side may be removed from the module substrate 20 shown in FIG. 3.

In such a configuration as well, effects similar to those of the above module substrate 20 can be obtained.

The module substrates antennas including the first to fourth coils are illustrated in the above embodiments. In the module substrate antenna of the present invention, however, the number of coils is not particularly limited, and five or more coils may be connected in parallel.

As in the case of FIG. 3, pluralities of the first to third coils 7, 8, and 15 shown in FIG. 6, each formed by arranging the first antenna coil pattern 3a, the third antenna coil pattern 4a, the fifth antenna coil pattern 13a, the second antenna coil pattern 5a, the fourth antenna coil pattern 6a, and the sixth antenna coil pattern 14a in this order, may be provided.

Similarly, pluralities of the first to fourth coils 7, 8, 15, and 19 shown in FIG. 8, each formed by arranging the first antenna coil pattern 3a, the third antenna coil pattern 4a, the fifth antenna coil pattern 13a, the seventh antenna coil pattern 17a, the second antenna coil pattern 5a, the fourth antenna coil pattern 6a, the sixth antenna coil pattern 14a, and the eighth antenna coil pattern 18a in this order, may be provided.

With such a configuration, effects similar to those of the module substrate 20 shown in FIG. 3 that includes the pluralities of first and second coils 7, 8 can be obtained.

The module substrate of the present invention can be effectively used as a module substrate on which an IC chip etc. is mounted and which includes a built-in multilayer coil component (dynamic tag) functioning as an antenna for wireless communication.

The invention claimed is:

1. A module substrate antenna, comprising:
   first and second coils connected in parallel,
   wherein:
      the first coil is composed of a pattern in which a spiral first antenna coil pattern and a spiral second antenna coil pattern are interlayer-connected in series,
      the second coil is composed of a pattern in which a spiral third antenna coil pattern and a spiral fourth antenna coil pattern are interlayer-connected in series,
      the first antenna coil pattern, the third antenna coil pattern, the second antenna coil pattern, and the fourth antenna coil pattern are located in this order, and
      the first to fourth antenna coil patterns are wounded so that directions of a current flowing through the first to fourth antenna coil patterns are all the same direction with respect to an axis of the coil, are wound so that the directions of a current in the first and third antenna coil patterns are the same direction with respect to a radial direction of the coil, and are wound so that the directions of a current in the second and fourth antenna coil patterns are an opposite direction to the direction of a current in the first and third antenna coil patterns with respect to the radial direction of the coil.

2. The module substrate antenna of claim 1, further comprising:
   pluralities of the first and second coils formed by arranging the first antenna coil pattern, the third antenna coil pattern, the second antenna coil pattern, and the fourth antenna coil pattern in this order.

3. The module substrate antenna of claim 1, further comprising:
   a third coil connected in parallel with the first and second coils,
   wherein:
      the third coil is composed of a pattern in which a spiral fifth antenna coil pattern and a spiral sixth antenna coil pattern are interlayer-connected in series,
      the first antenna coil pattern, the third antenna coil pattern, the fifth antenna coil pattern, the second antenna coil pattern, the fourth antenna coil pattern, and the sixth antenna coil pattern are located in this order, and
      the first to sixth antenna coil patterns are wound so that directions of a current flowing through the first to sixth antenna coil patterns are all the same direction with respect to the axis of the coil, are wound so that the directions of a current in the first, third, and fifth antenna coil patterns are the same direction with respect to the radial direction of the coil, and are wound so that the directions of a current in the second, fourth, and sixth antenna coil patterns are an opposite direction to the direction of a current in the first, third, and fifth antenna coil patterns with respect to the radial direction of the coil.

4. The module substrate antenna of claim 3, further comprising:
   pluralities of the first to third coils formed by arranging the first antenna coil pattern, the third antenna coil pattern, the fifth antenna coil pattern, the second antenna coil pattern, the fourth antenna coil pattern, and the sixth antenna coil pattern in this order.

5. The module substrate antenna of claim 3, further comprising:
   a fourth coil connected in parallel with the first to third coils,
   wherein
      the fourth coil is composed of a pattern in which a spiral seventh antenna coil pattern and a spiral eighth antenna coil pattern are interlayer-connected in series,
      the first antenna coil pattern, the third antenna coil pattern, the fifth antenna coil pattern, the seventh antenna coil pattern, the second antenna coil pattern, the fourth antenna coil pattern, the sixth antenna coil pattern, and the eighth antenna coil pattern are located in this order, and
      the first to eighth antenna coil patterns are wound so that directions of a current flowing through the first to eighth antenna coil patterns are all the same direction with respect to the axis of the coil, are wound so that the directions of a current in the first, third, fifth, and seventh antenna coil patterns are the same direction with respect to the radial direction of the coil, and are wound so that the directions of a current in the second, fourth, sixth, and eighth antenna coil patterns are an opposite direction to the direction of a current in the first, third, fifth, and seventh antenna coil patterns with respect to the radial direction of the coil.

6. The module substrate antenna of claim 5, further comprising:
   pluralities of the first to fourth coils formed by arranging the first antenna coil pattern, the third antenna coil pattern, the fifth antenna coil pattern, the seventh antenna coil pattern, the second antenna coil pattern, the fourth antenna coil pattern, the sixth antenna coil pattern, and the eighth antenna coil pattern in this order.

7. A module substrate, characterized by comprising the module substrate antenna of claim 1.

* * * * *